(12) United States Patent
Yang et al.

(10) Patent No.: US 11,892,252 B2
(45) Date of Patent: Feb. 6, 2024

(54) ADAPTABLE LIQUID CONNECTOR STRUCTURE

(71) Applicant: ASIA VITAL COMPONENTS CO., LTD., New Taipei (TW)

(72) Inventors: Ming-Tsung Yang, New Taipei (TW); Kuan-Lin Huang, New Taipei (TW); Sung-Wei Lee, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 58 days.

(21) Appl. No.: 17/400,122

(22) Filed: Aug. 12, 2021

(65) Prior Publication Data

US 2023/0050005 A1    Feb. 16, 2023

(51) Int. Cl.
*H05K 7/20* (2006.01)
*F28F 9/02* (2006.01)
*F16L 37/00* (2006.01)

(52) U.S. Cl.
CPC ............ *F28F 9/0251* (2013.01); *F16L 37/00* (2013.01); *H05K 7/20772* (2013.01)

(58) Field of Classification Search
None
See application file for complete search history.

(56) References Cited

U.S. PATENT DOCUMENTS

| 7,539,020 | B2* | 5/2009 | Chow ................ H05K 7/20781 361/759 |
| 8,336,922 | B2* | 12/2012 | Tiberghien ............. F16L 39/00 137/594 |
| 9,194,634 | B2* | 11/2015 | Tiberghien .............. F16L 37/34 |
| 9,351,428 | B2* | 5/2016 | Eckberg .................. F16L 37/34 |
| 10,164,373 | B1* | 12/2018 | Cheon ................ H05K 7/20781 |

(Continued)

FOREIGN PATENT DOCUMENTS

| CN | 101443591 A | 5/2009 |
| CN | 103162051 A | 6/2013 |

(Continued)

OTHER PUBLICATIONS

Search Report dated May 6, 2022 issued by Taiwan Intellectual Property Office for counterpart application No. 110126980.

(Continued)

*Primary Examiner* — Courtney L Smith
(74) *Attorney, Agent, or Firm* — Bradley J. Thorson; DeWitt LLP

(57) ABSTRACT

An adaptable liquid connector structure includes a case, an intermediate member and a liquid connector main body. The case is a hollow frame. The intermediate member is located in the case and includes an opening formed at a front area thereof for mounting the liquid connector main body therein, a locating bore located below the opening, and a plurality of elastic elements mounted on outer sides and a rear side of thereof. The intermediate member is supported by the elastic elements to suspend in the case and the elastic elements absorb assembly tolerance of the adaptable liquid connector structure, such that the liquid connector main body mounted therein is allowed for a positional floating adjustment in and relative to the case upward, downward, leftward and rightward to be smoothly, correctly and securely connected to an adaptor connector.

8 Claims, 4 Drawing Sheets

(56) References Cited

U.S. PATENT DOCUMENTS

| | | | | |
|---|---|---|---|---|
| 10,791,654 B2* | 9/2020 | McCordic | ........... | H01Q 21/0025 |
| 10,921,070 B2* | 2/2021 | Chen | ................... | H05K 7/20781 |
| 11,439,035 B2* | 9/2022 | Thibaut | ................ | H05K 7/1452 |
| 11,452,237 B2* | 9/2022 | Tan | ..................... | H05K 7/20272 |
| 2016/0270260 A1* | 9/2016 | Franz | ................. | H05K 7/20781 |
| 2017/0127575 A1* | 5/2017 | Lunsman | ............ | H05K 7/20263 |
| 2017/0257980 A1* | 9/2017 | Fukunaga | ................ | F16L 37/40 |

FOREIGN PATENT DOCUMENTS

| | | | |
|---|---|---|---|
| CN | 105953008 A | | 9/2016 |
| CN | 110513553 A | | 11/2019 |
| CN | 112020264 A | | 12/2020 |
| CN | 215445497 U | | 1/2022 |
| TW | M618369 U | | 10/2021 |

OTHER PUBLICATIONS

Search Report dated Jul. 10, 2022 issued by China National Intellectual Property Administration for counterpart application No. 2021108323148.

\* cited by examiner

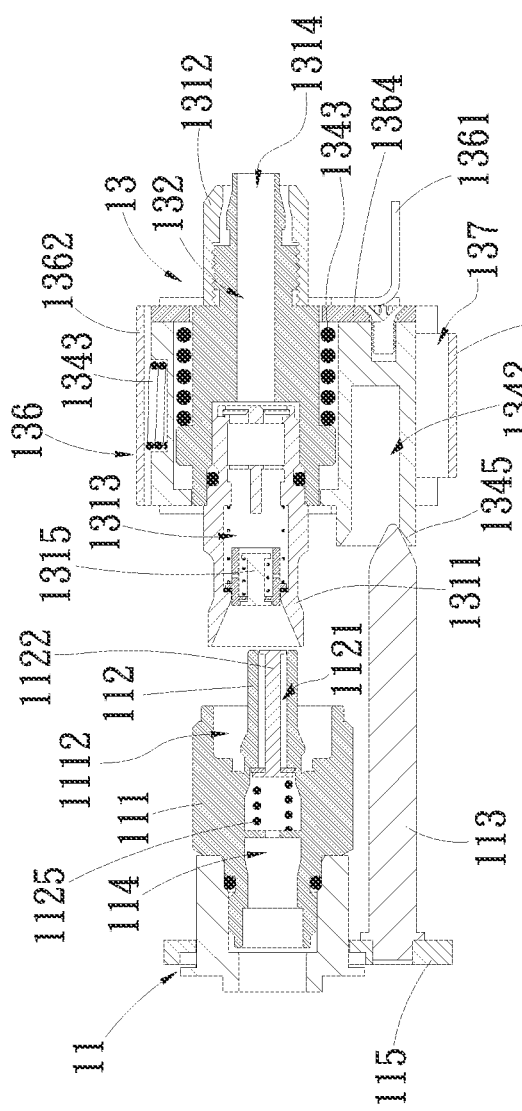
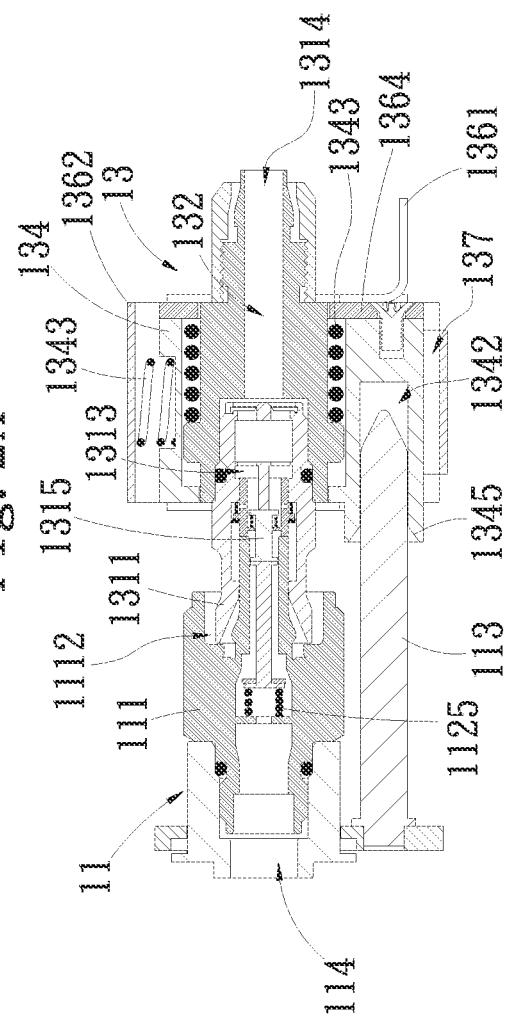
Fig. 2A
Fig. 2B

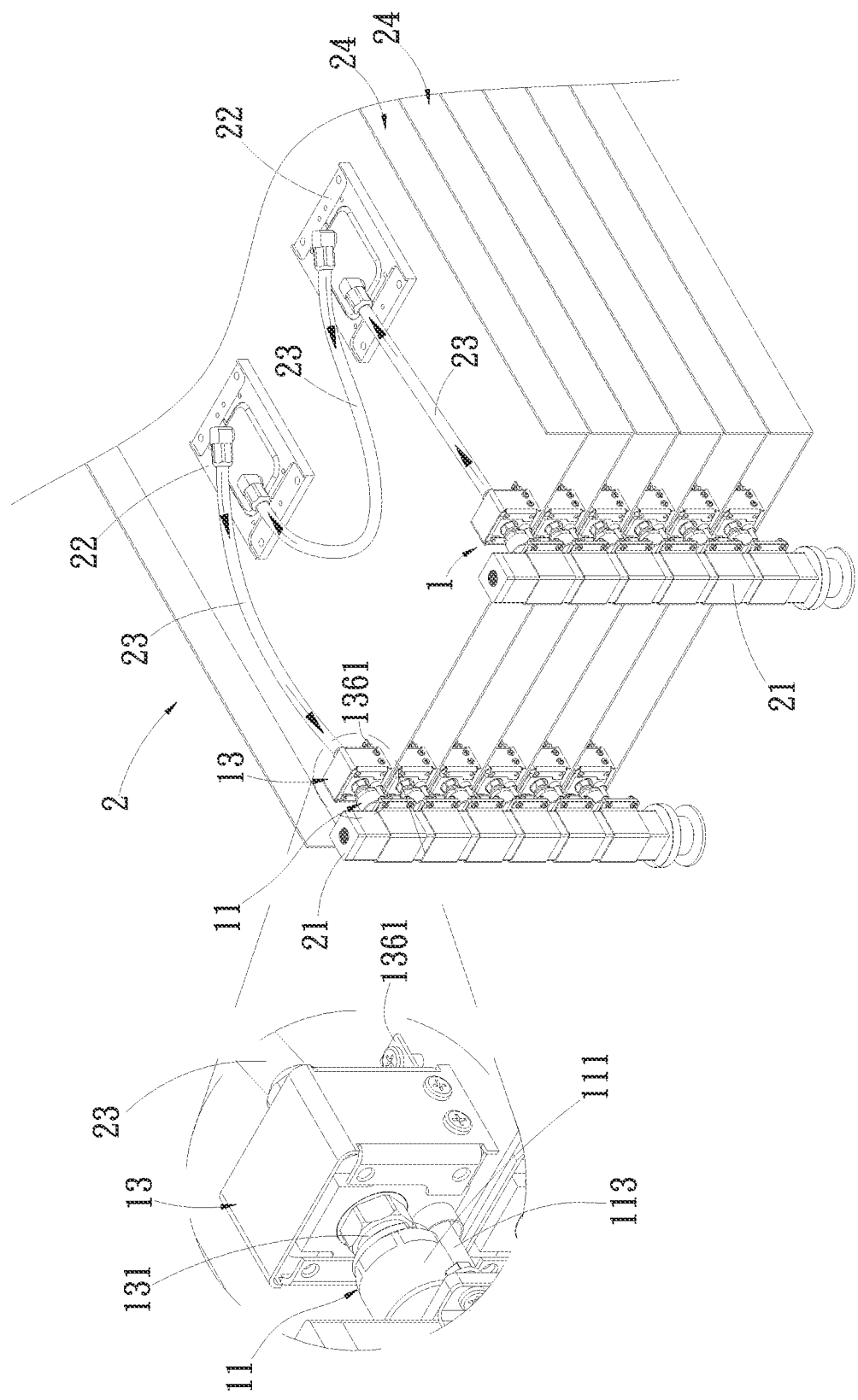

ADAPTABLE LIQUID CONNECTOR STRUCTURE

FIELD OF THE INVENTION

The present invention relates to an adaptable liquid connector structure, and more particularly, to an adaptable liquid connector structure that includes elastic elements to absorb manufacturing and assembly tolerances thereof and accordingly, allows for a blind mating with another connector to achieve the purpose of correct alignment and smooth assembling thereof.

BACKGROUND OF THE INVENTION

Recently, water-cooling systems have been largely applied to high-power heat sources for carrying away heat produced by the heat sources. Since the water-cooling system provides relatively good heat dissipation effect, it is not only applied to personal computers and desktop computers, but also widely applied to industrial computers or server racks for the purpose of heat dissipation. The water-cooling system generally applied to the server racks mainly includes a main pump, which pumps a working fluid, i.e. water, from a water tank and diverts the water into water blocks located corresponding to the heat sources of different servers in the server rack, so as to achieve a water cooling effect.

The diversion pipes included in the existing diverting pipeline on a server rack for guiding water to different water blocks on the servers are connected to the water pipe on the water blocks via a pair of fluid-communicable male and female connectors.

The male connector installed on one diversion pipe is provided with an insertion needle for guiding the male connector into an insertion hole provided on the female connector installed on the server, such that the male connector and the female connector can be connected end to end. However, both the female connectors on the servers and the male connectors on the diversion pipes have the problems of initially existed assembly tolerance and manufacturing tolerance of different parts thereof, it is inevitable the assembly tolerance between each pair of the female and male connectors is so large to exceed an allowed tolerance. This prevents the insertion needles on the male connectors from correspondingly inserting into the insertion holes on the female connectors to axially align the female connectors on all the servers with the male connectors on all the diversion pipes. Sometimes, it is necessary to replace or to change the locations of one or both of the male connectors on the diversion pipes of the pipeline on the server rack and the female connectors on the servers for all the male and female connectors to be adaptable and connectable to one another correspondingly. In the event two or more pairs of the replaced or changed female and male connectors for corresponding connecting to each other still have an excessively large alignment tolerance between them, they must be further replaced or changed until they can be aligned at the same axial line and be connected to each other. Thus, a lot of time is consumed for correcting the female and male connectors that could not be aligned with and smoothly connected to one another.

SUMMARY OF THE INVENTION

A primary object of the present invention is to provide an adaptable liquid connector structure applicable to a server. The adaptable liquid connector structure includes elastic elements to absorb assembly tolerance thereof and accordingly, allows for a blind mating of it with another connector to achieve the purpose of correct alignment and smooth assembling thereof.

To achieve the above and other objects, the adaptable liquid connector structure according to the present invention includes a case, an intermediate member and a liquid connector main body. The case is a hollow frame. The intermediate member is located in the case and includes an opening formed at a front area thereof for mounting the liquid connector main body therein, a locating bore located below the opening, and a plurality of elastic elements mounted on outer sides and a rear side of thereof. The intermediate member is supported by the elastic elements to suspend in the case and the elastic elements absorb assembly tolerance of the adaptable liquid connector structure, such that the liquid connector main body mounted therein is allowed for a positional floating adjustment in and relative to the case upward, downward, leftward and rightward to be correctly aligned with, securely connected to and smoothly assembled to another connector. Thus, the adaptable liquid connector structure is a quick connector very convenient for use.

The intermediate member is provided on at least two outer sides with one receiving section each. The receiving sections can be holes, slots, cavities, bosses or any other configuration that can serve as a connection means for holding the elastic elements in place. The elastic elements respectively have one end received in and fixed to one of the receiving sections and another end connected to at least two inner sides of the case. The intermediate member is further provided at a rear side with an elastic element, which is fitted on around a rear end of the liquid connector main body mounted in the opening of the intermediate member.

The intermediate member has a top and a bottom being covered by the case with a floating space formed between the bottom of the intermediate member and the case. The case can be formed of a single part or a plurality of parts. And, the liquid connector main body is a quick connector.

The elastic elements are respectively a spring. Since the intermediate member is supported by the elastic elements to suspend in the case, the liquid connector main body mounted in the intermediate member is allowed for a positional floating adjustment in and relative to the case forward and rearward. The case is connected to a water-cooled server rack, which is provided with an adaptor connector that has an adaptor main body and a locating section disposed adjacent to the adaptor main body. The liquid connector main body has an end connected to an end of the adaptor main body and another end connected to a water-cooling module. The locating bore is connected to the locating section. And, the adaptor main body is fluid-communicably connected at another end to a liquid manifold.

BRIEF DESCRIPTION OF THE DRAWINGS

The structure and the technical means adopted by the present invention to achieve the above and other objects can be best understood by referring to the following detailed description of the preferred embodiment and the accompanying drawings, wherein

FIG. 2A is a longitudinal sectional view showing the liquid connector structure is being connected to the adaptor connector;

FIG. 2B is a longitudinal sectional view showing the liquid connector structure and the adaptor connector are fully connected to each other; and FIG. 3 shows an application of the adaptable liquid connector structure of the present invention, in which a plurality of liquid connector structures is connected to a plurality of adaptor connectors that is mounted on a water-cooled server rack.

DETAILED DESCRIPTION OF THE PREFERRED EMBODIMENTS

Figure 1A:
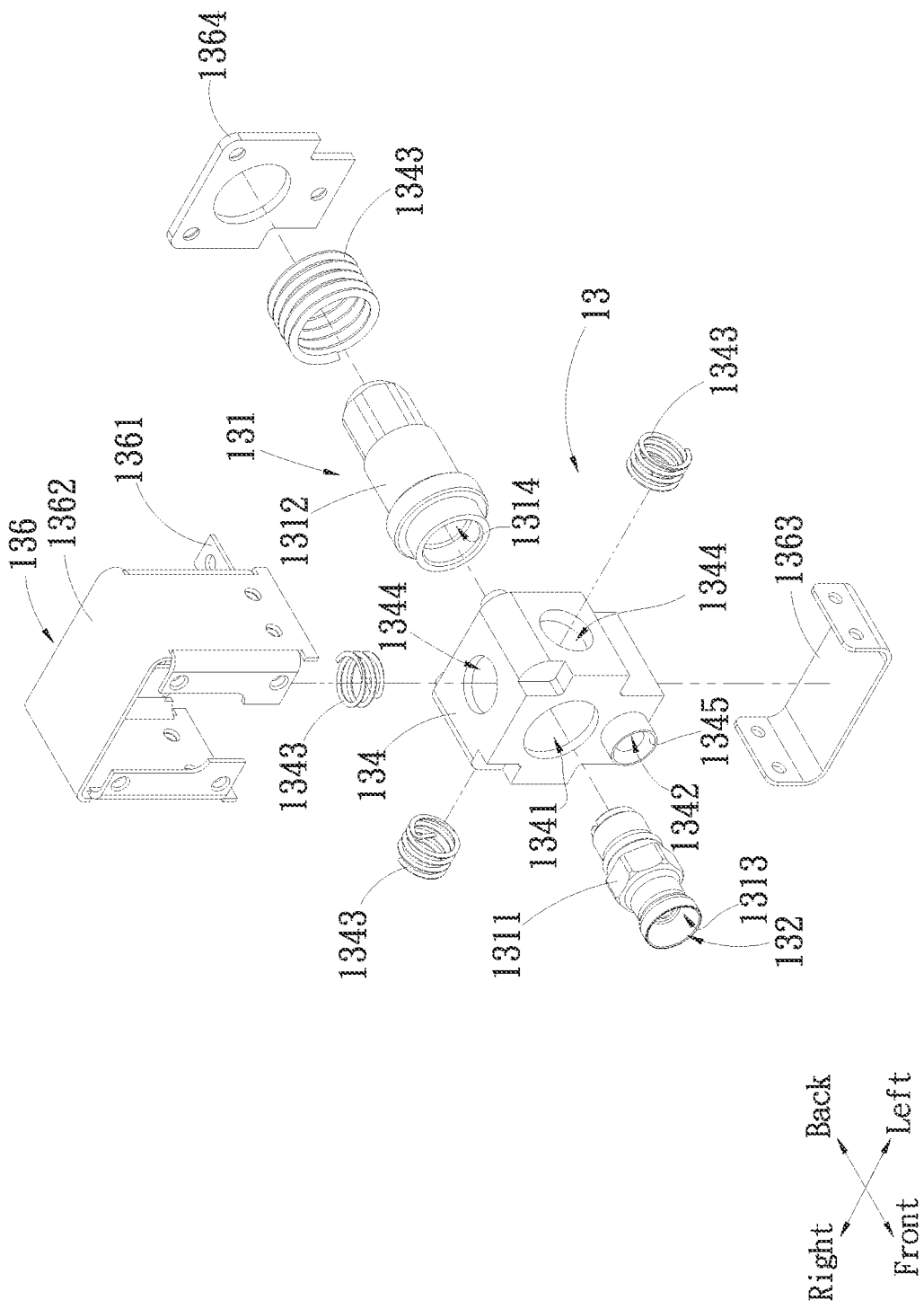
FIG. 1A is an exploded perspective view of a liquid connector structure according to a preferred embodiment of the present invention.

The present invention will now be described with a preferred embodiment thereof and by referring to the accompanying drawings.

Please refer to FIGS. 1A, 1B, 2A and 2B along with FIG. 3, in which a liquid connector structure 13 according to a preferred embodiment of the present invention is shown. As shown, the liquid connector structure 13 can be applied to a water-cooled server rack 2 by detachably connecting it to an adaptor connector 11 that is mounted on the water-cooled server rack 2. The adaptor connector 11 includes an adaptor main body 111 and a locating section 113. The liquid connector structure 13 includes a liquid connector main body 131, an intermediate member 134, and a case 136. The case 136 is a hollow frame, which can be formed of one single part or a plurality of parts. In the illustrated preferred embodiment, the case 136 is formed of a substantially n-shaped upper case 1362 and a substantially u-shaped lower case 1363. The intermediate member 134 has a top and a bottom being covered by the upper case 1362 and the lower case 1363, respectively. It is noted a floating space 137 is formed between the bottom of the intermediate member 134 and the lower case 1363. With the floating space 137, the whole intermediate member 134 is allowed to displace upward or downward in the case 136. Further, a stop member 1364 is connected to between an inner rear side of the upper case 1362 and the lower case 1363. An elastic element 1343 disposed in a rear side of the intermediate member 134 is pressed at a rear end against the stop member 1364.

The intermediate member 134 serves as a base and is provided with an opening 1341, a locating bore 1342, a plurality of elastic elements 1343 and a plurality of receiving sections 1344. The opening 1341 is located at a front central area of the intermediate member 134 for the liquid connector main body 131 to mount therein. The locating bore 1342 is located below the opening 1341. According to the preferred embodiment, the opening 1341 is extended from the front central area to a rear central area of the intermediate member 134 in a direction coaxial with the adaptor main body 111 for receiving the liquid connector main body 131 therein. The locating bore 1342 is extended from a front area toward a rear area of the intermediate member 134 in a direction coaxial with the locating section 113 for the locating section 113 to insert therein. A rim of the locating bore 1342 is inward tapered to form a beveled guide surface 1345 for guiding the locating section 113 into the locating bore 1342. In practical implementation of the present invention, a fixing member 1361 is provided on the upper case 1362 of the case 136 for connecting the case 136 to a server 24 on the water-cooled server rack 2, so that the liquid connector structure 13 is stably mounted on the server 24.

The intermediate member 134 is provided on at least two outer sides with one receiving section 1344 each. The receiving section 1344 can be a hole such as a recessed hole, or a slot, a cavity, a boss, or any other configuration that can serve as a connection means for holding the elastic elements 1343 in place. In the illustrated preferred embodiment, the receiving sections 1344 are respectively provided on an upper side, a left side and a right side of the intermediate member 134 to be located near and perpendicular to the opening 1341. The elastic elements 1343 are respectively an elastically deformable spring capable of providing a support effect, and are optionally disposed on one of the outer sides (i.e. the upper side, the left side or the right side) and the rear side of the intermediate member 134. In practical implementation of the present invention, the elastic elements 1343 can be provided only on the outer sides of the intermediate member 134.

The elastic elements 1343 respectively have an end received in and fixed to one of the receiving sections 1344 (i.e. the receiving sections 1344 on the upper, the left and the right side of the intermediate member 134) and another end connected to an inner upper side, an inner left side and an inner right side of the case 136. One of the elastic elements 1343 is fitted on around a rear end of the liquid connector main body 131 that is mounted in the opening 1341, so that a rear end of that elastic element 1343 is pressed on the stop member 1364. The intermediate member 134 is supported by the elastic elements 1343 to suspend in the middle of the case 136. More specifically, since the elastic elements 1343 respectively have one end elastically pressed on the inner sides of the case 136, the intermediate member 134 is allowed to float in the case 136 and is elastically adjustable in position relative to the case 136 in the x-axis, y-axis or z-axis direction at a right or a slant angle. In other words, the intermediate member 134 is movable and elastically adjustable in position in the case 136 in multi-dimensional directions to absorb manufacturing tolerances of the liquid connector main body 131 and the adaptor main body 111 when the two types of main bodies 131, 111 are to be connected to one another. In the illustrated preferred embodiment, the liquid connector main body 131 and the adaptor main body 111 are quick connectors that can be quickly connected to or quickly disconnected from each other. However, it is understood the present invention is not particularly limited thereto.

A front end of the liquid connector main body 131 and the locating bore 1342 are connected to a front end of the adaptor main body 111 and the locating section 113, respectively. When the locating section 113 of the adaptor connector 11 is in contact with and guided by the beveled guide surface 1345 to move into the locating bore 1342, as shown in FIG. 2A, the elastic elements 1343 elastically allow a floating adjustment of the intermediate member 134 in position in the case 136, such that the adaptor main body 111 and the liquid connector main body 131 can be located coaxially, i.e. located at the same axial line, and connected to each other, as shown in FIG. 2B. At this point, a first flow passage 114 in the adaptor main body 111 is communicable with a second flow passage 132 in the liquid connector main body 131. Briefly, with the above arrangements, manufacturing tolerances and assembly tolerances of the liquid connector main body 131 and the adaptor main body 111 are absorbed by the elastic deformation of the elastic elements 1343 provided on the intermediate member 134, enabling an elastically floating adjustment of the liquid connector main body 131 relative to the adaptor main body 111 until the two main bodies 111, 131 have aligned axial lines and allow for a quick connection to each other.

The following is a detailed structural description of the adaptor connector 11 and the liquid connector structure 1. Please refer to FIGS. 1B, 2A and 2B.

The adaptor connector 11 further includes a base plate 115 in addition to the adaptor main body 111 and the locating section 113. In the illustrated preferred embodiment, the locating section 113 is a long, rod-shaped locating needle, and is disposed adjacent to the adaptor main body 111. The locating section 113 and the adaptor main body 111 in the illustrated preferred embodiment are disposed on the base plate 115 adjacent to each other. However, in practical implementation of the present invention, the base plate 115 can be an integral part outward extended from a periphery of the adaptor main body 111.

The adaptor main body 111 internally defines the first flow passage 114 and includes an insertion section 112 and a coupling space 1112. The first flow passage 114 is axially extended through the adaptor main body 111; and the coupling space 1112 is internally defined at the front end of the adaptor main body 111 opposite to the first flow passage 114 for receiving and connecting the front end of the liquid connector main body 131 thereto. The insertion section 112 is disposed in the coupling space 1112 with an end located inside the coupling space 1112 and connected to an inner side of the adaptor main body 111. Another end of the insertion section 112 is exposed from the coupling space 1112 for correspondingly inserting into and connecting to the liquid connector main body 131.

The insertion section 112 internally defines a communicating flow passage 1121 and includes a first spool 1122 and a spring element 1125. The communicating flow passage 1121 communicates with the first flow passage 114. The first spool 1122 is provided in the communicating flow passage 1121 for controlling the communicating flow passage 1121 to communicate with or not communicate with the first flow passage 114. The spring element 1125 is disposed in the first flow passage 114 with an end pressed against an inner end of the first spool 1122 and another end pressed against a platform that is radially extended from a middle inner wall surface of the adaptor main body 111 toward the first flow passage 114.

The liquid connector main body 131 includes a front shell 1311, a rear shell 1312 and the second flow passage 132. The front shell 1311 has a front end connected to the coupling space 1112 of the adaptor main body 111 and a rear end backward extended into the opening 1341, and the rear shell 1212 has a rear end connected to a liquid pipe 23, such as a water pipe, and a front end forward extended into the opening 1341, such that the front shell 1311 and the rear shell 1312 are aligned with and connected to each other. The elastic element 1343 that is fitted on around the rear shell 1312 of the liquid connector main body 131 can absorb axial tolerance to achieve an adjustment of an axial distance or a gap of the liquid connector main body 131 relative to the adaptor main body 111 or provide a push force to push the liquid connector main body 131 toward the adaptor main body 111, such that the two main bodies 111, 131 can be tightly pressed against and connected to each other.

The front shell 1311 internally defines a front flow passage 1313 and includes a second spool 1315 provided in the front flow passage 1313. When the second spool 1315 is aligned with and connected to the first spool 1122, the front flow passage 1313 is communicable with the communicating flow passage 1121, as shown in FIG. 2B. On the other hand, when the second spool 1315 is not aligned with and not connected to the first spool 1122, the front flow passage 1313 is not communicable with the communicating flow passage 1121, as shown in FIG. 2A. The rear shell 1312 internally defines a rear flow passage 1314, which communicates with the front flow passage 1313 to together define the above-mentioned second flow passage 132. When one of the adaptor main body 111 and the liquid connector main body 131 is moved toward and inserted into the other part, the locating section 113 of the adaptor main body 111 is guided by the bevel guide surface 1345 of the locating bore 1342 of the liquid connector main body 131 toward the locating bore 1342, as shown in FIG. 2A. Meanwhile, the elastic elements 1343 on the intermediate member 134 are elastically deformable to achieve a floating adjustment of a position of the liquid connector main body 131 in the case 136 in different directions, including downward, upward, leftward, rightward, forward and/or rearward, until the liquid connector main body 131 is located at, for example, a height level aligned with the adaptor main body 111. At this point, the adaptor main body 111 is located at the same axial line as the liquid connector main body 131 and can be quickly inserted into and connected to the liquid connector main body 131, as shown in FIG. 2B. The above arrangement not only allows a blind mating between the two main bodies 111, 131, but also absorbs the assembly tolerance to enable correct alignment, secured connection and smooth assembling of the liquid connector structure 13 of the present invention to the adaptor connector 11.

Figure 1B:
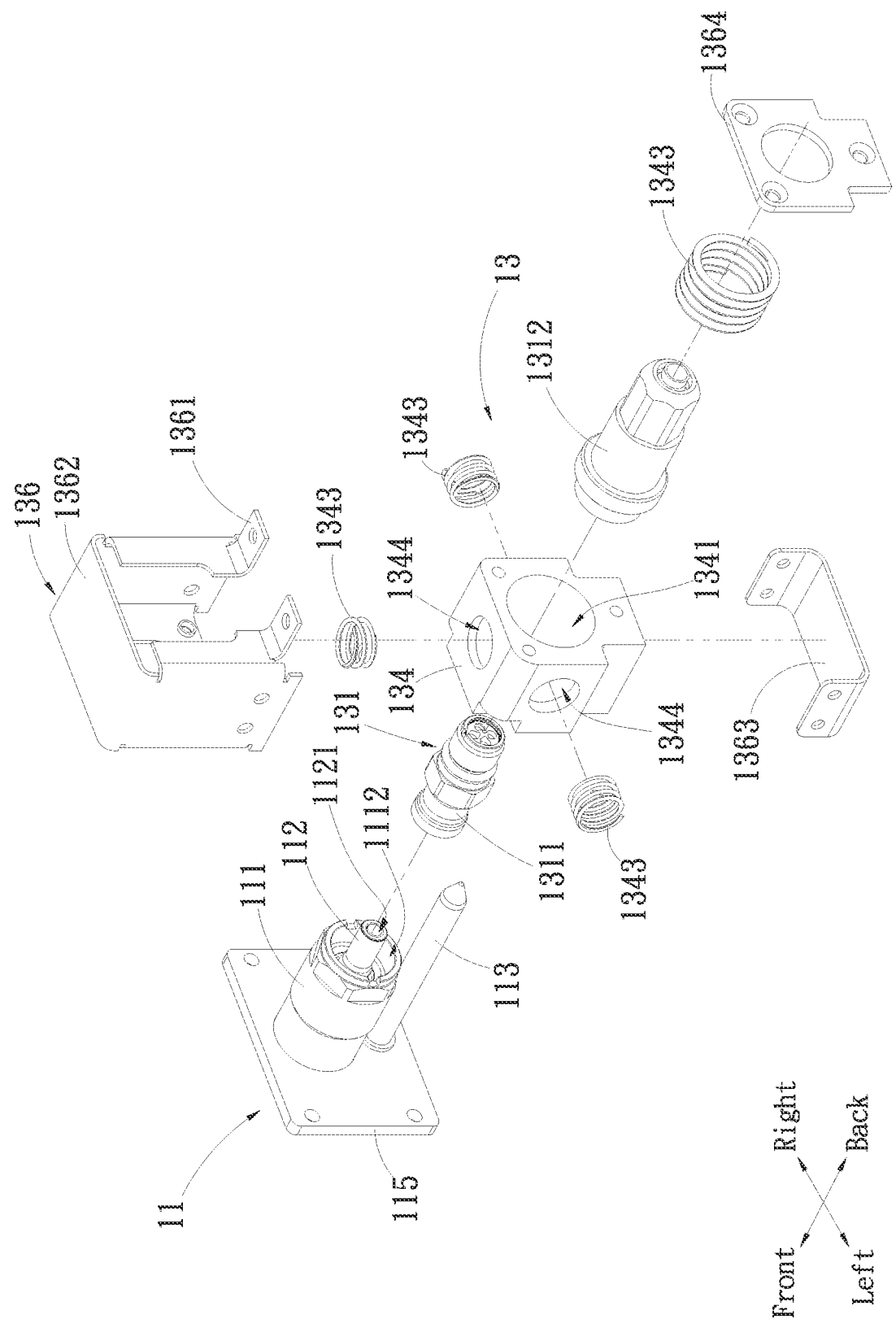
FIG. 1B is an exploded perspective view of the liquid connector structure and an adaptor connector to be used therewith.

Please refer to FIGS. 1A, 1B and 3. In practical implementation of the present invention, a plurality of liquid connector structures 13 of the present invention and a plurality of adaptor connector 11 are connected to a liquid pipeline of a water-cooled server rack 2. The liquid pipeline includes a plurality of liquid manifolds 21 and a plurality of liquid pipes 23. Every adaptor connector 11 works with one liquid connector structure 13 to form a set of blind-mating connectors. The water-cooled server rack 2 has a plurality of pull-out servers 24 mounted therein. The liquid manifolds 21 are oppositely erected near two sides of the water-cooled server rack 2. Every adaptor connector 11 has its base plate 115 fixed to one of the liquid manifolds 21 with a rear end of the adaptor main body 111 fluid-communicably connected to the liquid manifold 21. Every server 24 has two water-cooling modules 22 (such as two water blocks) attached to corresponding heat sources, such as central processing units. The two water cooling modules 22 are fluid-communicably connected via the liquid pipes 23 (such as water pipes) to the rear ends of the two liquid connector main bodies 131 mounted on two sides of the server 24. When the servers 24 are respectively pushed into the water-cooled server rack 2, the elastic elements 1343 on the intermediate member 134 of every liquid connector main body 131 can elastically deform to enable a positional floating adjustment of the intermediate member 134 in the case 136 to align with the corresponding adaptor main body 111 fixed to the liquid manifold 21, so that the liquid connector main body 131 and the adaptor main body 111 can be quickly connected to and fluid-communicable with each other.

With the liquid connector structure 13 of the present invention, the assembly tolerance between the adaptor main body 111 and the liquid connector main body 131 is absorbed by the elastic elements 1343 to allow a positional floating adjustment of the liquid connector main body 131 in the case 136 until the liquid connector main body 131 is aligned with the adaptor main body 111. At this point, the two main bodies 111, 131 form a set of blind-mating connectors that can be correctly and securely connected to each other to complete a quick assembling thereof.

The present invention has been described with a preferred embodiment thereof and it is understood that many changes and modifications in the described embodiment can be carried out without departing from the scope and the spirit of the invention that is intended to be limited only by the appended claims.

What is claimed is:

1. An adaptable liquid connector structure for quick connection or quick disconnection with an adaptor connector which has an adaptor main body and a locating section, the adaptable liquid connector structure comprising:
    a case being a hollow frame;
    an intermediate member including an opening formed at a front area thereof, a locating bore located below the opening, and a plurality of elastic elements mounted on outer sides thereof, the locating bore being connected to the locating section of the adaptor connector, such that the intermediate member is supported by the elastic elements to suspend in the case; and
    a liquid connector main body being mounted in the opening of the intermediate member, the liquid connector main body having an end connected to an end of the adaptor main body and wherein, since the intermediate member is supported by the elastic elements to suspend in the case, the liquid connector main body mounted therein is allowed for a positional floating adjustment in and relative to the case upward, downward, leftward or rightward.

2. The adaptable liquid connector structure as claimed in claim 1, wherein the intermediate member is provided on at least two outer sides with one receiving section each; and the elastic elements respectively having one end received in and fixed to the receiving sections and another end connected to at least two inner sides of the case.

3. The adaptable liquid connector structure as claimed in claim 1, wherein the intermediate member is provided at a rear side with an elastic element, which is fitted on around a rear end of the liquid connector main body mounted in the opening of the intermediate member.

4. The adaptable liquid connector structure as claimed in claim 1, wherein the intermediate member has a top and a bottom being covered by the case with a floating space formed between the bottom of the intermediate member and the case; and the case being formed of a single part or a plurality of parts.

5. The adaptable liquid connector structure as claimed in claim 1, wherein the liquid connector main body is a quick connector.

6. The adaptable liquid connector structure as claimed in claim 1, wherein the elastic elements are respectively a spring.

7. The adaptable liquid connector structure as claimed in claim 1, wherein, since the intermediate member is supported by the elastic elements to suspend in the case, the liquid connector main body mounted in the intermediate member is allowed for a positional floating adjustment in and relative to the case forward and rearward.

8. The adaptable liquid connector structure as claimed in claim 1, wherein the case is connected to a water-cooled server rack; the water-cooled server rack being provided with the adaptor connector, the locating section disposed adjacent to the adaptor main body; the liquid connector main body having another end connected to a water-cooling module; and the adaptor main body being fluid-communicably connected at another end to a liquid manifold.

\* \* \* \* \*